United States Patent
Gao et al.

(10) Patent No.: US 9,600,019 B2
(45) Date of Patent: Mar. 21, 2017

(54) METHOD AND APPARATUS FOR MODULATING A CLOCK SIGNAL

(71) Applicant: Freescale Semiconductor, Inc., Austin, TX (US)

(72) Inventors: Yuan Gao, France (FR); Pascal Kamel Abouda, France (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/919,815

(22) Filed: Oct. 22, 2015

(65) Prior Publication Data

US 2016/0344375 A1    Nov. 24, 2016

(30) Foreign Application Priority Data

May 22, 2015   (WO) .................. PCT/IB2015/000096

(51) Int. Cl.

| | |
|---|---|
| *G06F 1/04* | (2006.01) |
| *H03K 3/01* | (2006.01) |
| *H03K 5/04* | (2006.01) |
| *H03K 5/22* | (2006.01) |
| *H03K 5/00* | (2006.01) |

(52) U.S. Cl.
CPC .................. *G06F 1/04* (2013.01); *H03K 3/01* (2013.01); *H03K 5/04* (2013.01); *H03K 5/22* (2013.01); *H03K 2005/00286* (2013.01)

(58) Field of Classification Search
CPC ... G06F 1/04; H03K 3/00; H03K 3/01; H03K 3/011; H03K 3/017; H03K 5/04; H03K 5/05; H03K 5/22

USPC .......................... 327/113, 117, 291, 298, 299
See application file for complete search history.

(56) References Cited

U.S. PATENT DOCUMENTS

| | | | | |
|---|---|---|---|---|
| 4,929,849 | A | * | 5/1990 | Paul .................... G11B 20/1403 327/155 |
| 5,585,765 | A | * | 12/1996 | O'Shaughnessy ... H03K 3/0231 327/541 |
| 6,687,319 | B1 | | 2/2004 | Perino et al. |
| 2009/0135885 | A1 | | 5/2009 | Lin |
| 2011/0163785 | A1 | * | 7/2011 | Chen ......................... G06F 1/04 327/144 |

OTHER PUBLICATIONS

"Dithered Timing Spread Spectrum Clock Generation for Reduction of Electromagnetic Radiated Emission from High-speed Digital System", Jonghoon Kim et al, Electromagnetic Compatibility, 2002 http://ieeexplore.ieee.org/xpl/articleDetails.jsp?arnumber=1032514.

(Continued)

*Primary Examiner* — William Hernandez

(57) ABSTRACT

A clock modulation module and method for generating a modulated clock signal are provided. The clock modulation module comprises a comparator arranged to receive at a first input thereof a waveform signal, the waveform signal comprising a frequency representative of a frequency of a reference timing signal. The comparator is further arranged to receive at a second input thereof a reference voltage signal, and to output a modulated timing signal based on a comparison of the waveform signal and the reference voltage signal. Wherein the clock modulation module is arranged to output a modulated clock signal derived at least partly from the modulated timing signal output by the comparator.

16 Claims, 7 Drawing Sheets

(56) References Cited

OTHER PUBLICATIONS

"Spread Spectrum Clock Generator for reducing Electro-Magnetic Interference (EMI) Noise in LCD Driver IC", Jaehong Ko et al, Circuits and Systems, 2007 http://ieeexplore.ieee.org/xpl/articleDetails.jsp?arnumber=4488751.

"A Synchronization-Free Spread Spectrum Clock Generation Technique for Automotive Applications", Junfeng Zhou et al, IEEE Transactions on Electromagnetic Compatibility, vol. 53, No. 1, Feb. 2011 http://ieeexplore.ieee.org/xpl/login.jsp?tp=&arnumber=5713374.

* cited by examiner

METHOD AND APPARATUS FOR MODULATING A CLOCK SIGNAL

FIELD OF THE INVENTION

This invention relates to a clock modulation module and method therefor.

BACKGROUND OF THE INVENTION

It is known for a single, common clock signal to be used as a timing reference for multiple different functional components within an integrated circuit device. Consequently, operations carried out within multiple different functional components within an integrated circuit device can become synchronised to the frequency of the common clock signal, or derivations thereof. An effect of this synchronisation of operations is that it can result in a large amount of electromagnetic energy being concentrated around the synchronised operating frequencies of the various functional components, which can have an adverse effect on the correct functioning of components within the integrated circuit device.

In order to control the electromagnetic interference generated by functional components synchronised to a common clock signal, and thereby to assure electromagnetic compatibility (EMC), it is known to use a clock generator for generating the common clock signal that modulates the generated clock signal such that the clock signal has a 'spread' frequency. In this manner, the electromagnetic energy generated by the operations of the various functional components synchronised to the clock frequency is spread over a frequency small range (or derivative frequency ranges), reducing the peak electromagnetic energy levels generated.

However, a problem with modulating the frequency of the clock signal in this manner is that it introduces jitter into the clock signal, which cannot be tolerated by some functional components that may be present within an integrated circuit device. For example, the performance of timing sensitive circuits using capacitors with switching mechanism, such as analogue to digital converters and the like, is significantly degraded by the jitter introduced by frequency modulated clock signals. The use of such frequency modulation on a clock signal used to synchronise functional components can also introduce issues at the functional level, for example in terms of affecting setup and hold timings of critical data paths etc.

SUMMARY OF THE INVENTION

The present invention provides a clock modulation module, an integrated circuit device and a method for generating a modulated clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some embodiments of the present invention, there is provided a discrete clock modulation module arranged to receive a reference timing signal, such as an unmodulated clock signal, and to output a modulated clock signal. As described in greater detail below, the clock modulation module of the present invention utilises a comparator to implement the modulation of the clock signal. Specifically, the comparator is arranged to compare a waveform signal having a frequency representative of (e.g. derived from) the frequency of the unmodulated reference clock signal to a reference voltage signal, and to output a modulated timing signal based on said comparison. As described in greater detail below, by varying the voltage level of the reference voltage signal, a phase shift and duty cycle of the modulated timing signal may be varied, whilst maintaining an average frequency equal to that of the waveform signal.

Advantageously, the use of such a discrete clock modulation module to implement the clock signal modulation allows a simpler clock generator component to be implemented, reducing the design and test time of the clock generator component, as well as reducing the overall die size requirement for the generation and modulation of the clock signal.

Furthermore, the clock modulation module of the present invention implements the clock signal modulation without the use of multiple delay paths to vary the delay (and thus phase shift) of the clock signal edges, such delay paths requiring a large amount of die area to implement and being typically prone to variations in process, temperature and supply voltage. By contrast, the use of a comparator and a reference voltage signal to implement the modulation of the clock signal enables the modulation to be independent of variations in process, temperature and supply voltage, and thus enables accurate and stable modulation of the clock signal to be achieved.

Figure 1:
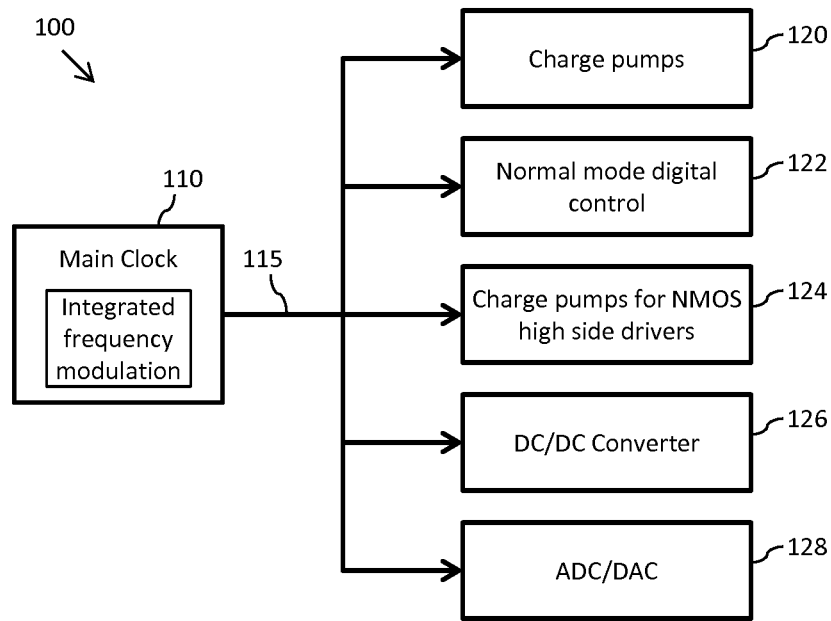
FIG. 1 illustrates a simplified block diagram of a conventional clock distribution network.

Referring first to FIG. 1, there is illustrated a simplified block diagram of a conventional clock distribution network 100. A clock generator component 110 is arranged to generate a common clock signal 115 provided to a plurality of functional components 120-128 of an integrated circuit device (not shown). Conventionally, modulation of the clock signal 115 is implemented within the clock generator component 110, for example through the control of a phase-locked loop within the clock generator 110, or through the use of multiple delay paths to vary the delay of the clock signal edges. Accordingly, the modulated clock signal 115 is provided to all of the functional components 120, 128.

However, as previously outlined above in the background of the invention, a problem with modulating the common (main) clock signal 115 in this manner is that it introduces jitter into the clock signal 115 provided to all functional components 120-128, which cannot be tolerated by some functional components that may be present within an integrated circuit device, such as analogue to digital and digital to analogue converters 128 and the like.

Figure 2:
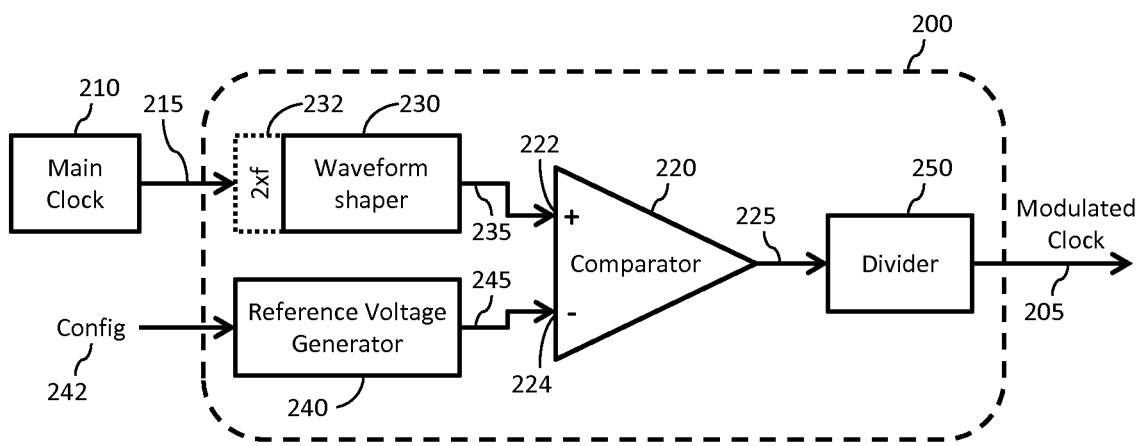
FIG. 2 illustrates a simplified block diagram of an example of a clock modulation module.

Referring now to FIG. 2, there is illustrated a simplified block diagram of an example of a clock modulation module 200, in accord with embodiments of the present invention. The clock modulation module 200 is arranged to receive a reference timing signal 215, which in the illustrated example is an unmodulated clock signal generated by clock generator component 210. As described in greater detail below, the clock modulation module 200 is arranged to generate a modulated clock signal 205 from the received reference timing signal 215.

The clock modulation module 200 includes a comparator 220. The comparator 220 is arranged to receive at a first (non-inverting in the illustrated example) input 222 thereof a waveform signal 235. The waveform signal 235 has a frequency representative of (i.e. being a multiple of) the frequency of the received reference timing signal 215, and in the illustrated example is generated by a waveform shaper component 230. The waveform shaper component 230 is arranged to receive the reference timing signal 215 (which may have, say, a generally square waveform), and to generate therefrom a waveform signal 235 having, say, a ramped (e.g. triangular) waveform.

The comparator 220 is further arranged to receive a reference voltage signal 245 at a second (inverting in the illustrated example) input 224 thereof, and to output a modulated timing signal 225 based on a comparison of the waveform signal 235 and the reference voltage signal 245.

Figure 3:
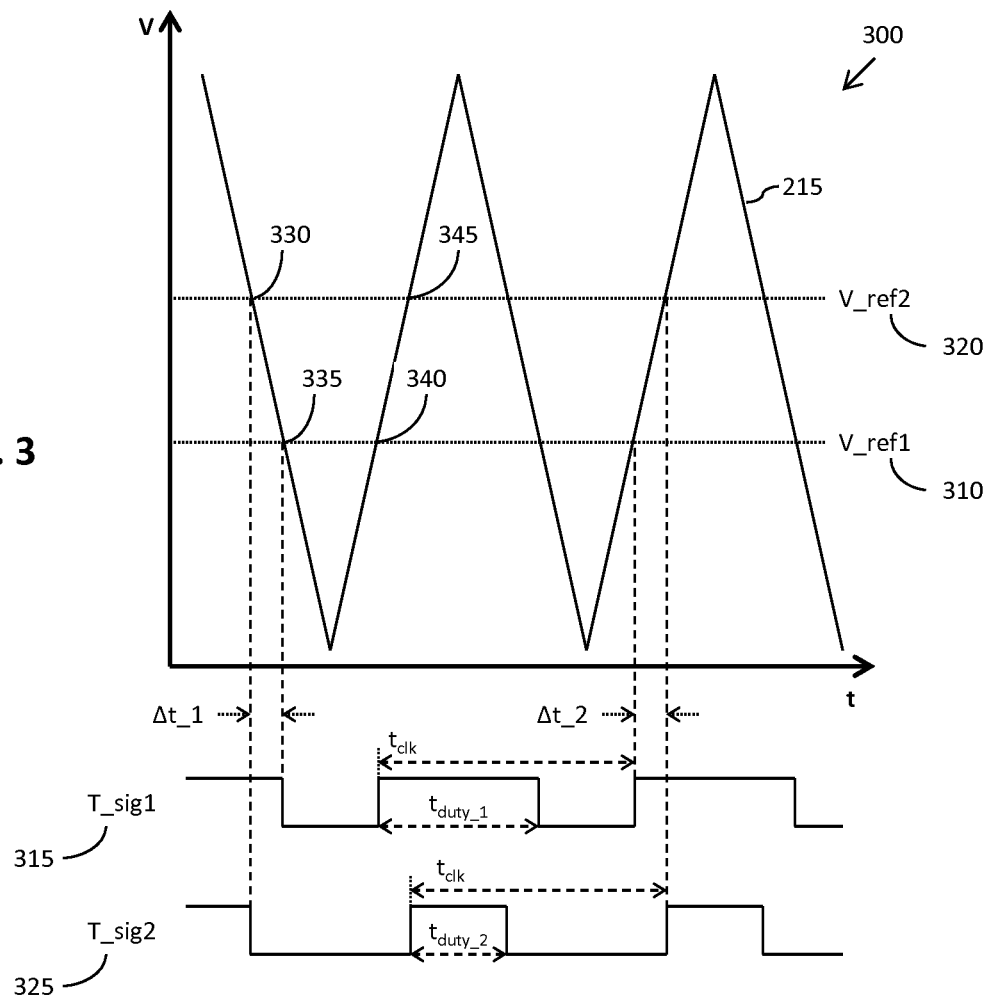
FIG. 3 illustrates a simplified plot of voltage versus time for a triangular waveform signal and example timing signals.

FIG. 3 illustrates a simplified plot 300 of voltage versus time for a triangular waveform signal 235 and example timing signals 315, 325 such as may be output by comparator 220 in response to reference voltage signals V_ref1 310 and V_ref2 320.

The first timing signal 315 represents an example of a timing signal 225 output by the comparator 220 when the waveform signal 235 has the triangular waveform illustrated in the plot 300 of FIG. 3, and when the first reference voltage signal V_ref1 310 is received at the second input 224 of the comparator 220. As can be seen from FIG. 3, when the waveform signal 235 has a voltage greater than the reference voltage signal V_ref1 310, the comparator 220 drives a 'high' voltage level at its output. Conversely, when the waveform signal 235 has a voltage less than the reference voltage signal V_ref1 310, the comparator 220 drives a 'low' voltage level at its output. In this manner, as the rising and falling voltage level of the waveform signal 235 crosses the voltage level of the reference voltage signal V_ref1 310 received at the second input of the comparator 220, the voltage level at the output of the comparator 220 changes, generating the generally square wave timing signal 315.

The second timing signal 325 represents a further example of a timing signal 225 output by the comparator 220 when the waveform signal 235 has the triangular waveform illustrated in the plot 300 of FIG. 3, and when the second reference voltage signal V_ref2 320 is received at the second input 224 of the comparator 220. In a similar manner as for the first timing signal 315, as the rising and falling voltage level of the waveform signal 235 crosses the voltage level of the second reference voltage signal 320 received at the second input of the comparator 220, the voltage level at the output of the comparator 220 changes, generating the generally square wave timing signal 325.

The second reference voltage signal V_ref2 320 has a higher voltage level than that of the first reference voltage signal V_ref1 310. Accordingly, in a descending part of the waveform cycle of the waveform signal 235, the triangular waveform signal 235 will cross the second reference voltage signal V_ref2 320 first, at an earlier point 330 in the waveform cycle, and cross the first reference voltage signal V_ref1 310, at a later point 335 in the waveform cycle. Accordingly, the timing signals 315, 325 have falling edges that are offset by a time difference $\Delta t\_1$. Additionally, in an ascending part of the waveform cycle of the waveform signal 235, the triangular waveform signal 235 will cross the first reference voltage signal V_ref1 310 first, at an earlier point 340 in the waveform cycle, and then cross the second reference voltage signal V_ref2 320, at a later point 345 in the waveform cycle. Accordingly, the timing signals 315, 325 have rising edges that are offset by a time difference $\Delta t\_2$.

The two timing signals 315, 325 have the same period ($t_{clk}$) as the triangular waveform signal 235. However, the timing signals 315, 325 have duty cycles ($t_{duty\_1}$ $t_{duty\_2}$ respectively) that differ by the sum of the time differences ($\Delta t\_1 + \Delta t\_2$), and are phase shifted with respect to one another (relative to their rising edges) by the time difference $\Delta t\_2$.

Thus, from FIG. 3 it can be seen that the period $t_{clk}$ (and thus the frequency) of the timing signal 225 output by the comparator 220 is defined by the waveform signal 235 received at the first input 222 thereof, whilst the duty cycle and phase of the timing signal 225 output by the comparator 220 may be controlled by way of the reference voltage signal 245 received at the second input 224 thereof. In this manner, by applying a varying reference voltage signal 245 to the second input 224 of the comparator 220, the comparator 220 may be caused to output a modulated timing signal 225 having an average frequency equal to the frequency of the waveform signal 235, but with varyingly delayed rising and falling edges that result in a varying (modulated) duty cycle and a varying (modulated) phase shift of the modulated timing signal 225. By modulating the timing signal 225 in this manner, electromagnetic energy generated by functional components synchronised to the modulated timing signal 225 will not be focussed on the frequency of the received (unmodulated) timing signal 215, but will be 'blurred by a small amount either side of the average frequency of the modulated signal as a result of the varying duty cycle and phase shift of the modulated timing signal 225. Thus, the electromagnetic energy will be dispersed across this blurred frequency range, reducing the peak electromagnetic energy levels generated.

Advantageously, the use of such a discrete clock modulation module 200 to implement the clock signal modulation allows a simpler clock generator component 210 to be implemented, as compared with the modulating clock generator component 110 illustrated in FIG. 1. One advantage of enabling a simpler clock generator component 210 to be implemented is that it can significantly reduce the design and test time of the clock generator component 210, which is a critical and sensitive component within an integrated circuit device, as well as reducing the overall die size requirement for the generation and modulation of the clock signal.

Significantly, the clock modulation module 200 illustrated in FIG. 2 implements the clock signal modulation without the use of multiple delay paths to vary the delay of the clock signal edges, which require a large amount of die area to implement and are typically prone to variations in process, temperature and supply voltage. In the illustrated example, the reference voltage signal 245 and comparator 220 are used to modulate the clock signal 205. Using a fast comparator which introduces minimal delay within the signal path (relative to the reference timing signal 215), the accuracy of the modulation will only be dependent on the reference voltage signal 245. Since integrated circuit devices typically include at least one reference voltage that has been compensated for variations in process, temperature and supply voltage, an accurate and reliable reference voltage signal 245 may be easily derived from such an existing compensated reference voltage.

Figure 4:
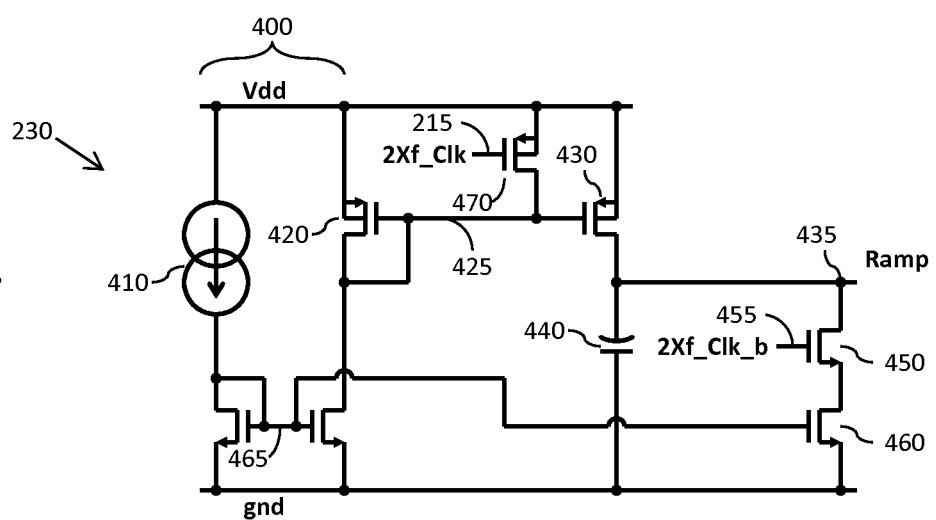
FIG. 4 illustrates a simplified circuit diagram of an example implementation of a waveform shaper component.

A waveform signal 235 in the form of a linear ramped (e.g. triangular) waveform enables a linear relationship to be achieved between the reference voltage signal 245 and the modulated timing signal 225 output by the comparator 220, simplifying the control of the modulation applied to the clock signal 205 output by the clock modulation module 200. For completeness, FIG. 4 illustrates a simplified circuit diagram of an example implementation of the waveform shaper component 230 illustrated in FIG. 2 for generating a ramped waveform signal 235. The waveform shaper component 230 illustrated in FIG. 4 includes a current mirror circuit 400, whereby a current from a current source 410 located within a first leg of the current mirror circuit 400 is mirrored within a second leg of the current mirror circuit 400. Transistor 420 located within the second leg of the current mirror circuit 400 is arranged to convert the current flowing there through into a voltage signal at its gate node 425. Transistor 430 is arranged to convert the voltage at its gate node 425 into a current flowing there through. The current flowing through transistor 430 is provided to an output node 435 of the waveform shaper component 230. A capacitor 440 is coupled between the output node 435 of the waveform shaper component 230 and ground. Transistors 450 and 460 are also coupled in series between the output node 435 of the waveform shaper component 230 and ground. The gate of transistor 450 is arranged to receive an inverse of the reference timing signal '2Xf_Clk_b' 455, whilst the gate of transistor 460 is coupled to the gate node 465 of the current mirror circuit 400. Transistor 470 is coupled between supply voltage vdd and the gate node 425 of the transistors 420, 430. The gate of transistor 470 is arranged to receive the timing signal '2Xf_Clk' 215.

Referring back to FIG. 2, in the illustrated example the clock modulation module 200 further includes a reference voltage generator component 240 arranged to generate the reference voltage signal 245. In accordance with some examples, the reference voltage generator component 240 is arranged to receive one or more configuration signals 242, and to output a reference voltage signal 245 based at least partly on the received configuration signal(s) 242. In this manner, the reference voltage signal 245 provided to the comparator 220, and thus the modulation applied to the timing signal 225 output thereby, may be configured by way of the configuration signal(s) 242.

Figure 5:
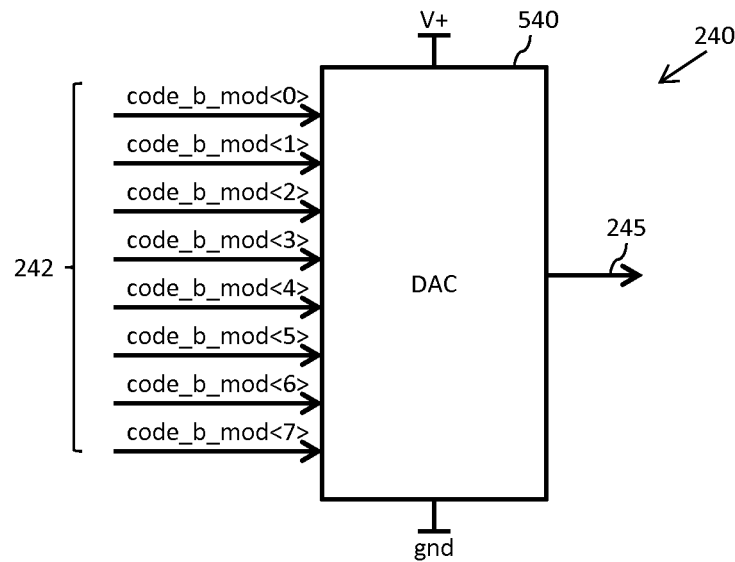
FIG. 5 illustrates a simplified block diagram of an example implementation of a reference voltage generator component.

FIG. 5 illustrates a simplified block diagram of an example implementation of the reference voltage generator component 240. In the example illustrated in FIG. 5, the reference voltage generator component 240 includes a digital to analogue converter (DAC) 540 arranged to receive an 8-bit digital configuration signal 242, and to drive a voltage at its output corresponding to the received 8-bit digital configuration signal 242, the voltage at the output of the DAC 540 providing the reference voltage signal 245. The digital configuration signal 242 may be provided by any appropriate on-chip or off-chip component (not shown), such as for example a general purpose processing unit, dedicated control unit, etc.

Figure 6:
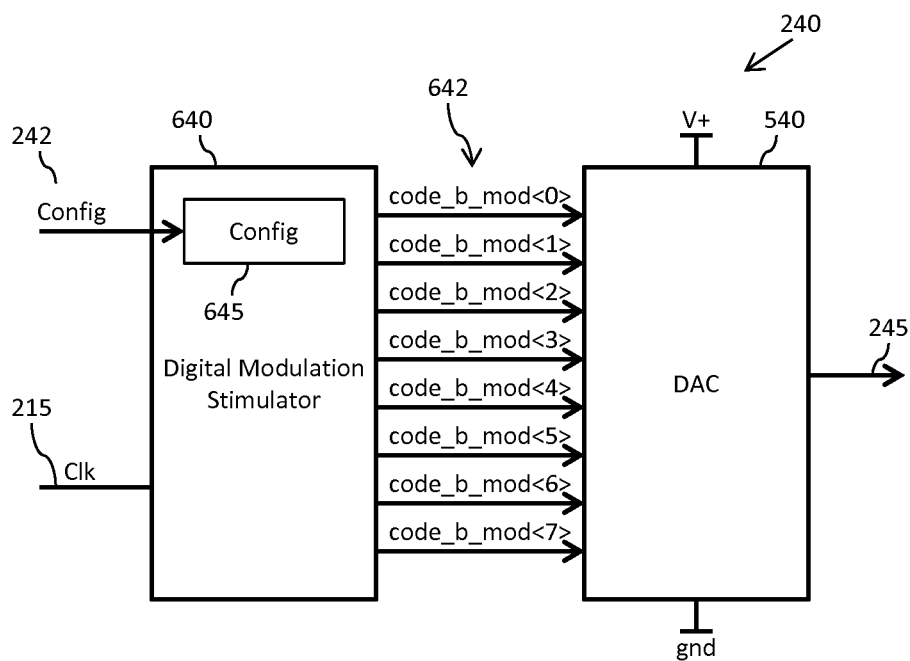
FIG. 6 illustrates a simplified block diagram of an alternative example implementation of a reference voltage generator component.

FIG. 6 illustrates a simplified block diagram of an alternative example implementation of the reference voltage generator component 240. In the example illustrated in FIG. 6, the reference voltage generator component 240 again includes a DAC 540 arranged to receive an 8-bit digital configuration signal 642. However, in the example illustrated in FIG. 6, the reference voltage generator component 240 further includes a digital modulation stimulation component 640 having at least one memory element 645 within which modulation configuration information is stored. The memory element 645 may be writable via the configuration signals 242, thereby enabling, say, application program code executing on a processing core (not shown) and/or boot functionality (not shown) to configure the modulation configuration information stored therein. Alternatively, the modulation configuration information may be hardcoded into the memory element 645, for example during fabrication.

The digital modulation stimulation component 640 is arranged to generate an 8-bit digital configuration signal 642 provided to the DAC 540 in accordance with the modulation configuration information stored within the memory element 645. It is contemplated that the modulation configuration information stored within the memory element 645 may include information identifying a modulation profile to be implemented, and one or more modulation parameter values for the identified modulation profile. For example, the modulation configuration information stored within the memory element 645 may identify that a static modulation profile is to be implemented, whereby the reference voltage signal 245 to be generated has a constant voltage level (such as the reference voltage signals V_ref1 310 and V_ref2 320 illustrated in FIG. 3), along with a parameter defining the voltage level of the reference voltage signal 245. As such, the digital modulation stimulator may configure a static 8-bit digital configuration signal 642 corresponding to the voltage level parameter defined in the memory element. The DAC will accordingly drive a continuous voltage at its output in accordance with the received, static 8-bit digital configuration signal 642, within the voltage at the output of the DAC 540 providing a static reference voltage signal 245 for the comparator. In this manner, a modulated timing signal 225 having a constant phase shift and duty cycle defined by the static reference voltage signal 245 will be output by the comparator 220.

Figure 7:
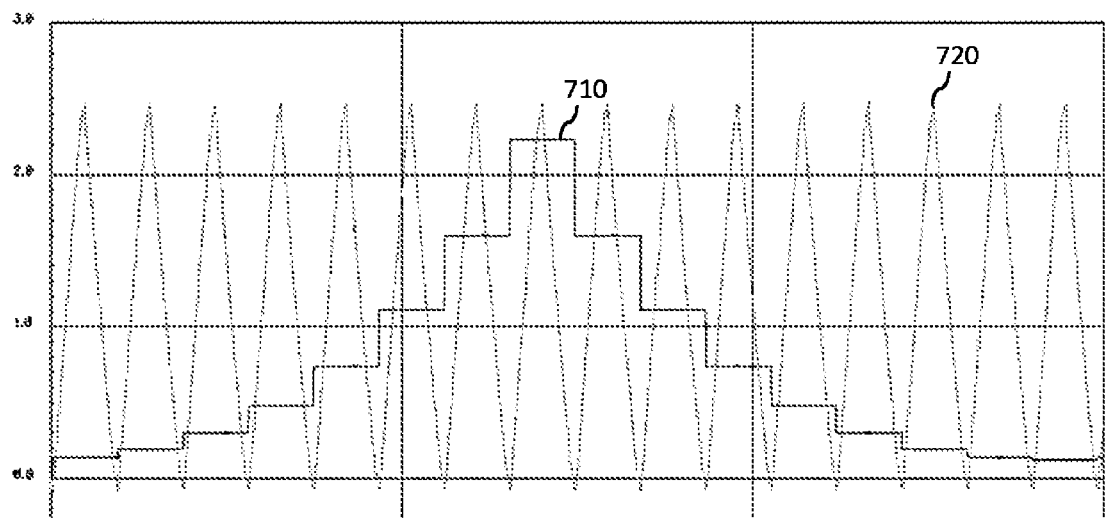
FIG. 7 illustrates a graph showing voltage versus time for an example of a stepped modulation profile for a reference voltage signal.

Alternatively, the modulation configuration information stored within the memory element 645 may identify that a stepped modulation profile is to be implemented, along with one or more parameters defining, say, step size and duration etc. FIG. 7 illustrates a graph showing voltage versus time. The graph of FIG. 7 includes a first plot 710 showing an example of such a stepped modulation profile for the reference voltage signal 245. The graph of FIG. 7 also includes a second plot 720 showing an example of ramped waveform signal 235 received at the first input 222 of the comparator 220. As can be seen from the graph of FIG. 7, the voltage level of the reference voltage signal 245 illustrated by the first plot 710 'steps' up or down at the start of each cycle of the waveform signal 235. In the example illustrated in FIG. 7, the stepped modulation profile has a 'ramped' profile, whereby the voltage level of the reference voltage signal 245 is alternately ramped up and down between high and low levels at stepped increments. The step sizes may be defined by parameters stored within the memory element 645 in combination with the characteristics of the DAC 540. In the example illustrated in FIG. 7, ramping up may be implemented by sequentially setting one more of the bit values of the 8-bit digital configuration signal 642 to a logical '1' value each cycle of the waveform signal 235. For example, during a first ramping up cycle only a first bit (code_b_mod<0) is set to a logical '1' value. During the next ramping up cycle, both the first bit (code_b_mod<0) and the second bit (code_b_mod<1) are set to a logical '1' value. In this manner the DAC 540 increases the voltage level in accordance with the number of bits set to a logical '1' value. In the example illustrated in FIG. 7, the first bit (code_b_mod<0) represents the least significant bit, whilst the last bit (code_b_mod<7) represents the most significant bit. As such, the step sizes increases as the significance of the bit being set increases.

Figure 8:
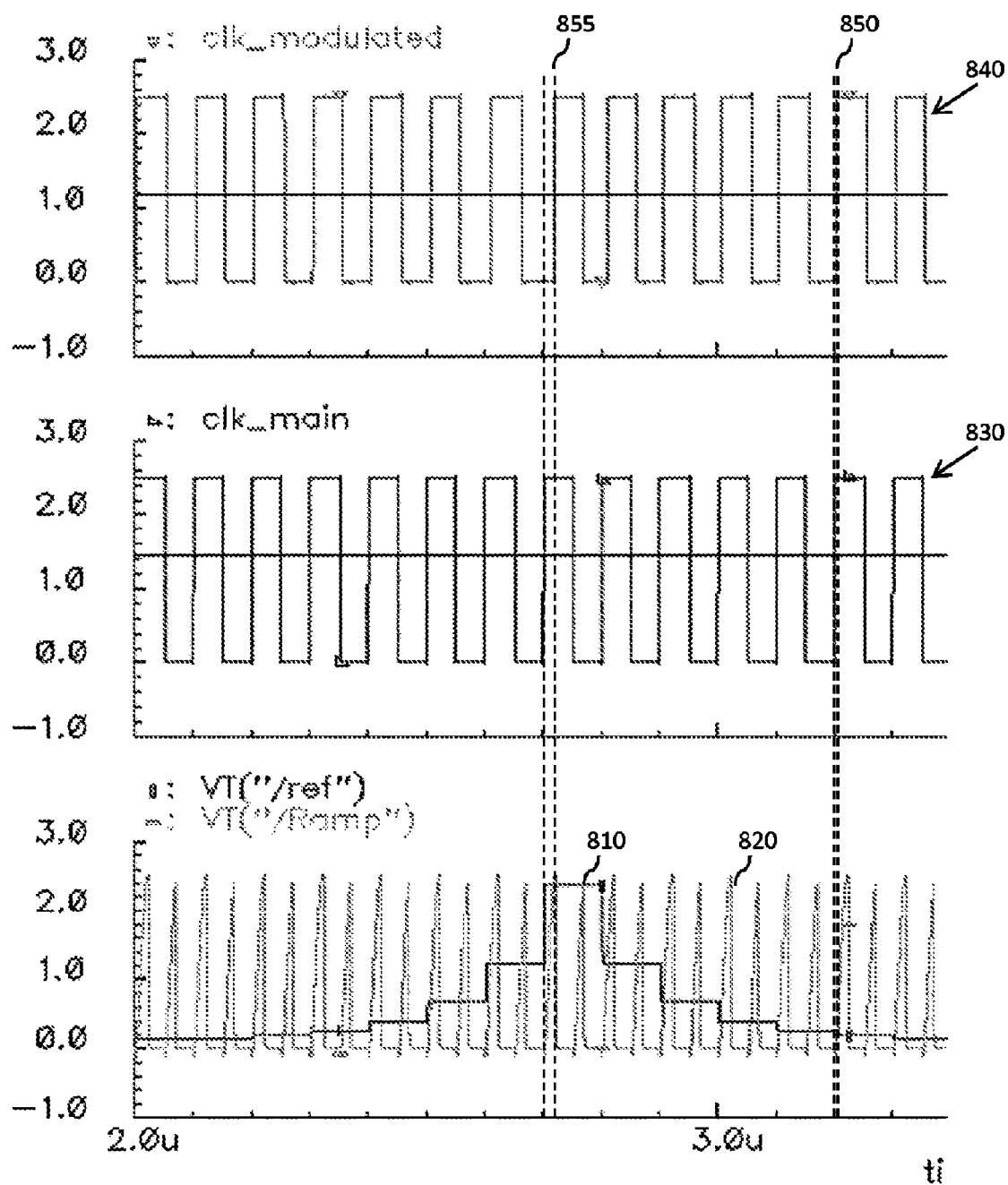
FIG. 8 illustrates a graph showing voltage versus time for an alternative example of a stepped modulation profile for a reference voltage signal.

FIG. 8 illustrates a further graph showing voltage versus time. The graph of FIG. 8 includes a first plot 810 showing an alternative example of a stepped modulation profile for the reference voltage signal 245. The graph of FIG. 8 also includes a second plot 820 showing an example of ramped waveform signal 235 received at the first input 222 of the comparator 220. As can be seen from the graph of FIG. 8, the voltage level of the reference voltage signal 245 illustrated by the first plot 710 again 'steps' up or down at the start of each cycle of the waveform signal 235, and the stepped modulation profile has a ramped profile, whereby the voltage level of the reference voltage signal 245 is alternately ramped up and down between high and low levels at stepped increments. In the example illustrated in FIG. 8, the ramping up step sizes are defined by: $Vref(n+1)=1/(1+Vref(n))$, whilst the ramping down step sizes are defined by: $Vref(n+1)=1/(1-Vref(n))$.

The graph of FIG. 8 further includes a plot 830 showing the reference timing signal 215 received by the clock modulation component 200 and a plot 840 showing the modulated clock signal 205 output by the clock modulation component 200. A phase shift between the (constant) reference timing signal 215 and the modulated clock signal 205 is indicated at two points 850, 855 within the graph of FIG. 8. As can be seen from FIG. 8, the phase shift between the reference timing signal 215 and the modulated clock signal 205 is significantly smaller when the reference voltage signal 245 has a smaller voltage level, at point 855.

Although in the examples illustrated in FIGS. 5 and 6 a DAC 540 has been used to generate the reference voltage signal 245, it will be appreciated that the present invention is not limited to such implementations, and it is contemplated that any suitable means for generating a reference voltage signal 245 may alternatively be implemented. For example, it is contemplated that in some examples analogue circuitry may be used to generate a fixed or varying reference voltage signal.

Referring back to FIGS. 2 and 3, as described above the voltage level of the reference voltage signal 245 not only has an effect on the phase shift of the modulated timing signal 225 output by the comparator 220, but also on the duty cycle of the modulated timing signal 225, as illustrated in FIG. 3. For some functional components within an integrated circuit device, it may be important that the clock signal provided thereto has a 50% duty cycle. In the example illustrated in FIG. 2, the clock modulation module 200 further includes a divider component 250, which receives at an input thereof the modulated timing signal 225, and outputs the modulated clock signal 205. In order to ensure the modulated clock signal 205 output by the clock modulation module 200 has a 50% duty cycle, the divider component 250 is arranged to alternate between driving a logical '1' and a logical '0' at its output, and is triggered to switch the logical state being driven at its output upon, say, each rising edge received at its input. In some alternative examples, the divider component 250 may be triggered to switch the logical state being driven at its output upon each falling edge received at its input. In this manner, the divider component 250 is arranged to output a modulated clock signal 205 having a frequency half that of the modulated timing signal 225, but with a 50% duty cycle irrespective of the duty cycle of the modulated timing signal 225.

It will be appreciated that if a 50% duty cycle is not important, the divider component 250 may be omitted.

In the illustrated examples, the waveform shaper component 230 is further arranged to generate a waveform signal 235 having a frequency double that of the received reference timing signal 215. For example, and as illustrated in FIG. 2, the waveform shaper component 230 may include a frequency double component 232 arranged to double the frequency of the reference timing signal 215 prior to generating the ramped waveform signal 235.

In this manner, the modulated timing signal 225 output by the comparator 220 will also have an average frequency double that of the received reference timing signal 215. As a result, the modulated clock signal 205 output by the divider, which has a frequency half that of the modulated timing signal 225, will have an average frequency equal to that of the reference timing signal 215.

Figure 9:
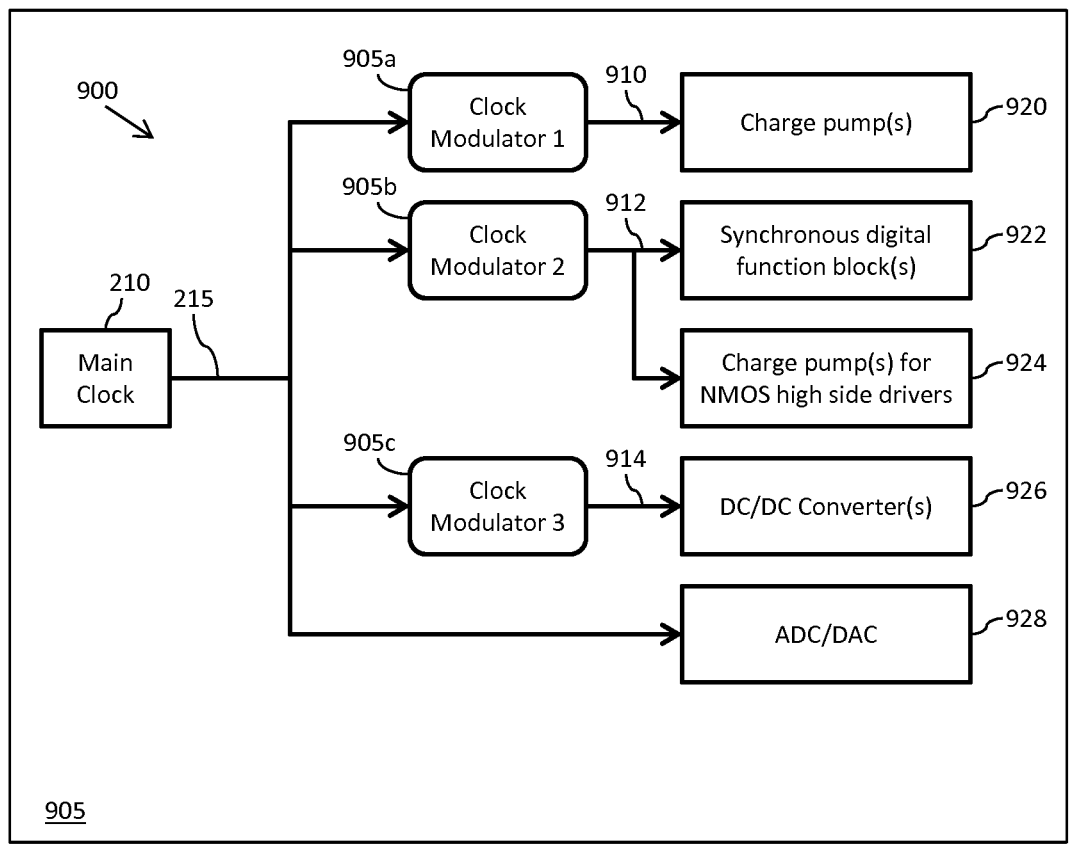
FIG. 9 illustrates a simplified block diagram of a part of a clock distribution network.

Referring now to FIG. 9, there is illustrated a simplified block diagram of a part of a clock distribution network 900 implemented within an integrated circuit device 905 and including clock modulation modules 905a-905c. In some examples, each of the clock modulation modules 905a-905c may be implemented by way of the clock modulation module 200 illustrated in FIG. 2. In the example illustrated in FIG. 9, each of the clock modulation modules 905a-905c is arranged to receive the unmodulated clock signal 215 output by clock generator component 210, and to generate therefrom a modulated clock signal 910, 912, 914 provided to one or more functional components 920-926 within the integrated circuit device 905. Specifically for the illustrated example, a first clock modulation module 905a is arranged to generate a first modulated clock signal 910 provided to one or more charge pumps 920, a second clock modulation module 905b is arranged to generate a second modulated clock signal 912 provided to one or more synchronous digital function blocks 922 and one or more charge pumps for NMOS (N-type metal oxide semiconductor) high side drivers 924, and a third clock modulation module 905c is arranged to generate a third modulated clock signal 914 provided to one or more DC (direct current) to DC converters 926.

As previously mentioned, the use of such standalone clock modulation modules 905a-905c to implement the clock signal modulation allows a simpler clock generator component 210 to be implemented, as compared with the modulating clock generator component 110 illustrated in FIG. 1. In addition, an unmodulated (and thus substantially jitter-free) clock signal 215 is available for functional components that are intolerant of jitter, such as analogue to digital converters (ADCs) and the like, illustrated generally at 928 in FIG. 9.

Furthermore, the clock modulation modules 905a-905c may be configured individually to apply different modulation to their respective modulated clock signals 910, 912, 914. In this manner, the effectiveness of the overall clock modulation applied to the clock signal 215 may be improved. For example, a more aggressive modulation may be applied to the modulated clock signals 910-914 provided to less sensitive functional components 920-926, whilst less aggressive modulation may be applied to the modulated clock signals 910-914 provided to more sensitive functional components 920-926. Additionally/alternatively the modulation applied to the modulated clock signals 910 may be arranged such that the modulated clock signals 910-915 are phase shifted relative to each other and to the unmodulated clock signal 215, thereby avoiding simultaneous switching of functional components synchronised to different clock signals 215, 910-915. In this manner, the electromagnetic peaks within the integrated circuit device 905 may be further reduced.

Furthermore, and as described above, the use of a comparator 220 and reference voltage signal 245 (FIG. 2) to implement the modulation of the clock signals 910-915 enables such modulation to be independent of variations in process, temperature and supply voltage, thereby enabling accurate and stable modulation of the clock signals.

Figure 10:
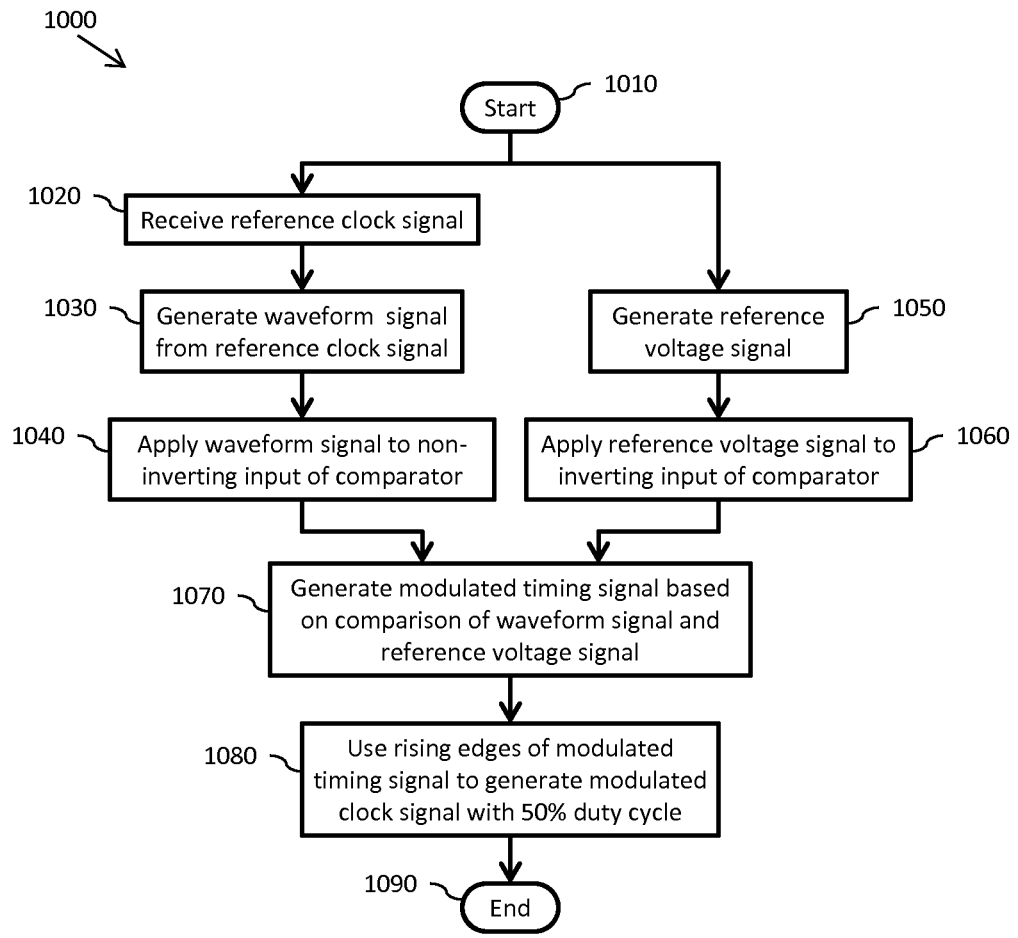
FIG. 10 illustrates a simplified flowchart of an example of a method of generating a modulated clock signal.

Referring now to FIG. 10, there is illustrated a simplified flowchart 1000 of an example of a method of generating a modulated clock signal, such as may be implemented within the clock modulation module 905 illustrated in FIG. 2. The method starts at 1010, and moves on to 1020 where a reference clock signal is received, such as the reference timing signal 215 illustrated in FIG. 2. A waveform signal, such as the waveform signal 235 illustrated in FIG. 2, is then generated from the reference clock signal, the waveform signal having a frequency representative of the frequency of the received clock signals. In some examples, the waveform signal may have a frequency double that of the frequency of the received reference clock signal. The waveform signal is then applied to a first (non-inverting in the illustrated example) input of a comparator, at 1040. The method further includes generating reference voltage signal at 1050, such as the reference voltage signal 245 illustrated in FIG. 2. The reference voltage signal is then applied to a second (inverting in the illustrated example) input of the comparator, at 1060. A modulated timing signal is then generated based on a comparison by the comparator of the waveform signal and the reference voltage signal, at 1070, such as the modulated timing signal 225 output by the comparator 220 of FIG. 2. Rising edges of the modulated timing signal are then used to generate a modulated clock signal with 50% duty cycle, such as the modulated clock signal 205 output by the divider component 250 of FIG. 2. The method then ends, at 1090.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the clock modulation modules 200a-200c illustrated in FIG. 7 are shown as separate, independent functional blocks. However, it is contemplated that two or more such clock modulation modules may share functional components. For example, a single waveform shaper component 230 may be shared by multiple clock modulation components 200a-200c, with the waveform signal 235 generated by the shared waveform shaper component 230 being provided to multiple comparators 220 within multiple clock modulation components 200a-200c.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type. Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A clock modulation module comprising a reference voltage generator component and a comparator, the comparator arranged to:
   receive at a first input thereof a waveform signal, the waveform signal comprising a frequency representative of a frequency of a reference timing signal,
   receive at a second input thereof a reference voltage signal, and
   output a modulated timing signal based on a comparison of the waveform signal and the reference voltage signal;
   the clock modulation module arranged to output a modulated clock signal derived at least partly from the modulated timing signal output by the comparator; and
   the reference voltage generator component arranged to:
   receive at least one configuration signal, and
   generate the reference voltage signal based at least partly on the received at least one configuration signal.

2. The clock modulation module of claim 1 further comprising a waveform shaper component arranged to receive at an input thereof the reference timing signal and to generate there from the waveform signal comprising a frequency representative of the reference timing signal.

3. The clock modulation module of claim 2, wherein the waveform shaper component is arranged to generate a ramped waveform signal.

4. The clock modulation module of claim 2, wherein the waveform shaper component is arranged to generate a waveform signal comprising a frequency double that of the reference timing signal.

5. The clock modulation module of claim 1 further comprising a divider component arranged to receive at an input thereof the modulated timing signal output by the comparator, and to alternate between driving a logical '1' and a logical '0' at its output;
   the divider component being triggered to switch the logical state driven at its output upon receipt of one of rising edges and falling edges at its input; and
   the clock modulation module is arranged to output as the modulated clock signal the signal output by the divider component.

6. The clock modulation module of Claim 1 wherein the reference voltage generator component comprises a digital to analogue component arranged to receive a multi-bit digital configuration signal and to drive as the reference voltage signal a voltage at its output corresponding to the received multi-bit digital configuration signal.

7. An integrated circuit device comprising:
   at least one clock modulation module, wherein the at least one clock modulation module comprises a comparator arranged to:
   receive at a first input thereof a waveform signal, the waveform signal comprising a frequency representative of a frequency of a reference timing signal,
   receive at a second input thereof a reference voltage signal, and
   output a modulated timing signal based on a comparison of the waveform signal and the reference voltage signal,
   wherein the clock modulation module further comprises a reference voltage generator component arranged to generate the reference voltage signal, and wherein the reference voltage generator component comprises a digital to analogue component arranged to receive a multi-bit digital configuration signal and to drive as the reference voltage signal a voltage at its output corresponding to the received multi-bit digital configuration signal; and
   wherein the clock modulation module is arranged to output a modulated clock signal derived at least partly from the modulated timing signal output by the comparator.

8. The integrated circuit device of claim 7 further comprising a waveform shaper component arranged to receive at an input thereof the reference timing signal and to generate there from the waveform signal comprising a frequency representative of the reference timing signal.

9. The integrated circuit device of claim 8, wherein the waveform shaper component is arranged to generate a ramped waveform signal.

10. The integrated circuit device of claim 8, wherein the waveform shaper component is arranged to generate a waveform signal comprising a frequency double that of the reference timing signal.

11. The integrated circuit device of claim 7, wherein the clock modulation module further comprises a divider component arranged to receive at an input thereof the modulated timing signal output by the comparator, and to alternate between driving a logical '1' and a logical '0' at its output;
 the divider component being triggered to switch the logical state driven at its output upon receipt of one of rising edges and falling edges at its input; and
 the clock modulation module is arranged to output as the modulated clock signal the signal output by the divider component.

12. A method of generating a modulated clock signal, the method comprising:
 receiving a reference timing signal;
 generating a waveform signal comprising a frequency representative of a frequency of the reference timing signal, wherein the waveform signal has a waveform signal frequency and the waveform signal frequency is a multiple of a reference frequency of the reference timing signal;
 applying the generated waveform signal to a first input of a comparator;
 generating a reference voltage signal:
 applying the generated reference voltage signal to a second input of the comparator;
 generating the modulated clock signal based at least partly on a modulated timing signal output by the comparator.

13. The method of claim 12, wherein the waveform signal comprises a ramped waveform signal.

14. The method of claim 12, wherein the waveform signal comprises a frequency double that of the reference timing signal.

15. The method of claim 12, wherein one of rising edges and falling edges of the modulated timing signal output by the comparator are used to generate the modulated clock signal comprising a frequency half that of the modulated timing signal output by the comparator.

16. The method of claim 12, wherein a frequency of the modulated timing signal output by the comparator is divided by the multiple to generate the modulated clock signal.

* * * * *